United States Patent [19]

Chebiniak et al.

[11] Patent Number: 4,552,787

[45] Date of Patent: Nov. 12, 1985

[54] DEPOSITION OF A METAL FROM AN ELECTROLESS PLATING COMPOSITION

[75] Inventors: Paul Chebiniak, Endicott; Ronald A. Kaschak, Vestal; Lois J. Root, Whitney Point, all of N.Y.

[73] Assignee: International Business Machines Corporation, Armonk, N.Y.

[21] Appl. No.: 584,960

[22] Filed: Feb. 29, 1984

[51] Int. Cl.$^4$ .............................................. B32D 3/10
[52] U.S. Cl. .................................. 427/304; 427/305; 427/306; 427/328; 427/343; 427/437; 427/438; 427/405
[58] Field of Search ............................ 427/304–307, 427/328, 343, 437, 438, 405

[56] References Cited

U.S. PATENT DOCUMENTS

| | | | |
|---|---|---|---|
| 3,222,207 | 12/1965 | Marshall | 427/306 |
| 3,672,964 | 6/1972 | Bellis | 427/328 |
| 3,882,050 | 5/1975 | Niebylski | 427/343 |
| 3,930,963 | 1/1976 | Polichette et al. | 427/306 |
| 4,122,215 | 10/1978 | Vratny | 427/305 |
| 4,154,869 | 5/1979 | Luft | 427/306 |
| 4,169,171 | 9/1979 | Narcus | 427/306 |
| 4,293,592 | 10/1981 | Morishita et al. | 427/305 |

*Primary Examiner*—Sam Silverberg
*Assistant Examiner*—Janyce A. Bell
*Attorney, Agent, or Firm*—Pollock, Vande Sande & Priddy

[57] ABSTRACT

A metal is deposited onto a substrate from an electroless plating solution by plating an initial layer of metal onto the substrate, then contacting the metal-plated substrate with a solution of an acid; and plating an additional layer of metal onto the plated, acid-treated substrate. The process reduces the plating void defects.

17 Claims, No Drawings

DEPOSITION OF A METAL FROM AN ELECTROLESS PLATING COMPOSITION

TECHNICAL FIELD

The present invention is concerned with a method for depositing a metal onto a substrate from an electroless plating composition. The present invention is especially applicable for depositing copper, nickel, and/or gold onto a desired substrate. The present invention makes it possible to substantially reduce the presence of plating voids from the electroless plating bath.

BACKGROUND OF THE INVENTION

The electroless plating of various metals, such as copper and nickel onto a substrate is well-known in the prior art. For instance, an electroless or autocatalytic copper plating bath usually contains a cupric salt, a reducing agent for the cupric salt, a chelating or complexing agent, and a pH adjuster. In addition, if the surface being plated is not already catalytic for the deposition of the desired metal, a suitable catalyst is deposited on the substrate prior to contact with the plating bath. Among the more widely employed procedures for catalyzing a substrate is the use of stannous chloride sensitizing solution and a palladium chloride activator to form a layer of metallic palladium particles.

Although, the technology relative to electroless copper plating is continually being improved, there still remains room for additional improvement. Certain problems are especially pronounced when preparing articles of very high quality, such as those to be employed in printed circuit applications, e.g., printed circuit boards which contain high-density circuitry and large numbers of holes such as through-holes and blind holes. The problems encountered include the formation of voids on the surface and in the coatings located in the holes. This, in turn, can cause unreliable electrical connections. Moreover, even if the electrical connections initially are adequate, the presence of voids tends to cause the coatings to crack during use of the circuits. During operation, integrated circuit boards tend to expand and contract somewhat. Any discontinuities in the coating represent a prime site for cracking due to the mechanical stress from such expansion and contraction.

Accordingly, it would be advantageous and desirable to reduce the formation of voids.

SUMMARY OF INVENTION

The present invention provides a method for significantly reducing, if not entirely eliminating, the formation of voids during plating, from an electroless plating bath. The present invention is concerned with a process for depositing a metal onto a substrate from an electroless plating solution. In particular, the process of the present invention includes plating an initial layer of an electroless platable metal from an electroless plating bath onto the desired substrate. The resulting metal-plated substrate is then contacted with an acid. An additional layer of an electroless platable metal is plated onto the resulting plated, acid-treated substrate from an electroless plating bath.

BEST AND VARIOUS MODES FOR CARRYING OUT INVENTION

According to the present invention, it has been found that improved plating can be achieved wherein the plating from an electroless plating bath is interrupted by removing the substrate from the bath and contacting it with an acid. The plating is then continued after the treatment with the acid. By employing the acid treatment step, the plating void defects are significantly reduced if not entirely eliminated.

The acid treatment in accordance with the present invention is preferably a treatment with an aqueous solution of the acid. Suitable acids include inorganic acids such as HCl, $H_2SO_4$, $HNO_3$, and $H_3PO_4$, and water soluble organic acids such as formic acid and acetic acid. The preferred acids are the inorganic acids and most preferably HCl.

The compositions employed in the acid treatment usually contain about 5% to about 25% by weight of the acid and preferably about 10% to about 25% by weight of the acid. The treatment is generally from about 1 to about 5 minutes and preferably about 1 to about 3 minutes. In addition, it is preferred that the acid composition be at a temperature of about normal room temperature or below for the acid treatment. Use of elevated temperatures for the acid treatment may result in attack of the plated metal by the acid.

After the treatment with the acid, the substrate is preferably rinsed with water and, most preferably, with deionized water.

Examples of suitable metals which can be plated in accordance with the present invention include copper, nickel and gold. Of course, if desired, mixtures of these metals can be plated. The preferred metal is copper.

The surface upon which the metal is plated must be catalytic for the deposition of the metal. For instance, in the event the surface being plated is not already catalytic for the deposition of the metal such as copper, a suitable catalyst is deposited on the surface prior to contact with the plating bath. Among the more widely employed procedures, for catalyzing a substrate is the use of a stannous chloride sensitizing solution and a palladium chloride activator for forming a layer of metallic palladium particles. One such surface is an epoxy-fiberglass laminate containing already deposited metal such as copper in those areas where the metal is to be plated. Another such surface is an epoxy-fiberglass laminate seeded with a stannous chloride and palladium chloride activating system.

Copper electroless plating baths and their method of application suitable for carrying out the present invention are disclosed in U.S. Pat. Nos. 3,844,799 and 4,152,467, disclosures of which are incorporated herein by reference.

The copper electroless plating bath is generally an aqueous composition which includes a source of cupric ion, a reducing agent for the cupric ion, a complexing agent for the cupric ion, and a pH adjuster. The plating baths also preferably include a cyanide ion source and surface-active agent. The cupric ion source generally used is a cupric sulfate or a cupric salt of the complexing agent to be employed.

When employing cupric sulfate, it is preferred to use amounts from about 3 to about 15 grams/liter and most preferably, about 8 to about 12 grams/liter.

The most common reducing agent employed is formaldehyde which, in the preferred aspects of the present invention, is used in amounts from about 0.7 to about 7 grams/liter and most preferably, from about 0.7 to about 2.2 grams/liter.

Examples of some other reducing agents include formaldehyde precursors or derivatives such as paraformaldehyde, trioxane, dimethylhydantoin, and glyoxal; borohydrides, such as alkaline metal borohydrides (sodium and potassium borohydrides) and substituted borohydrides, such as sodium trimethoxy borohydrides; and boranes, such as amine borane (isopropyl amine borane and morpholine borane).

Examples of some suitable complexing agents include Rochelle salts, ethylene diamine tetraacetic acid, the sodium (mono-, di-, tri-, and tetra-sodium) salts of ethylene diamine tetraacetic acid, nitrolotetraacetic acid and its alkali salts, gluconic acid, gluconates, triethanolamine, glucono (gamma)-lactone, modified ethylene diamine acetates, such as N-hydroxyethyl ethylene diamine triacetate. In addition, a number of other suitable cupric complexing agents are suggested in U.S. Pat. Nos. 2,938,805; 2,996,408; 3,075,855; and 3,075,856. The amount of complexing agent is dependent upon the amount of cupric ions present in the solution and is generally from about 20 to about 50 grams/liter, or in a 3-4 fold molar excess.

The plating bath can also include a surfactant which assists in wetting the surface to be coated. A satisfactory surfactant is, for instance, an organic phosphate ester available under the trade designation "Gafac RE-610". Generally, the surfactant is present in amounts from about 0.02 to about 0.3 grams/liter.

In addition, the pH of the bath is also generally controlled for instance, by the addition of a basic compound such as sodium hydroxide or potassium hydroxide in the desired amount to achieve the desired pH. The preferred pH of the electroless plating bath is between 11.6 and 11.8.

Also, preferably, the plating bath contains a cyanide ion and most preferably, contains about 10 to about 25 milligrams per liter to provide a cyanide ion concentration in the bath within the range of 0.0002 to 0.0004 molar.

Examples of some cyanide which can be employed according to the present invention are the alkali metal, alkaline earth metal, and ammonium cyanide. In addition, the plating bath can include other minor agents as is known in the art.

The preferred plating baths employed have a specific gravity within the range of 1.06 to 1.08. Moreover, the temperature of the bath is preferably maintained between about 70° C. and about 80° C. and most preferably, between 70° C. and 75° C. For a discussion of the preferred plating temperature coupled with the preferred cyanide ion concentrations, see U.S. Pat. No. 3,844,799.

Also, it is preferred to maintain the $O_2$ content of the bath between 2 ppm and 4 ppm and preferably about 2.5 ppm to about 3.5 ppm as discussed in U.S. Pat. No. 4,152,467. The $O_2$ can be controlled by injecting oxygen or air and an inert gas into the bath.

The overall flow rate of the gases into the bath is generally from about 1 to about 20 SCFP per thousand gallons of bath and preferably, from about 3 to about 8 SCFP per thousand gallons of bath.

The substrates to be plated are contacted with the plating bath for a sufficient time to provide an initial layer of the metal less than the desired total thickness of the plating to be provided prior to the acid treatment.

Usually, the first or initial treatment in the plating bath prior to the acid treatment provides from about 5% to about 95% of the total thickness of metal desired and preferably provides about 5% to about 50%, and most preferably about 5% to about 25% of the total thickness desired. The most preferred aspects employ plating for about 1 to about 5 hours prior to the treatment with the acid and then about another 8 to 20 hours of plating after the treatment with the acid.

As discussed above, the critical aspect of the present invention is that the plating cycle be interrupted by a treatment with an acid in order to substantially eliminate the occurrence of plating voids. The treatment with the acid to achieve the results obtained by the present invention is quite surprising since there have been suggestions of employing an acid in at least one other step during plating which does not result in substantially eliminating plating voids. For instance, U.S. Pat. No. 4,008,343 to Cohen, et al., suggests a process for the electroless plating of copper or nickel onto a sensitized substrate wherein the sensitized substrate is rinsed with an inorganic acid immediately after the surface is sensitized but before any plating occurs.

In addition, it has been suggested to interrupt or stop the initial plating step in certain electroless plating processes. For instance, U.S. Pat. No. 3,212,917 to Tsu, et al., relates to the process for the electroless plating of nickel wherein the plating step is interrupted by a step of baking to remove moisture from a partially plated substrate. In addition, U.S. Pat. No. 3,959,523 to Grunwald, et al., relates to an electroless plating process wherein there is a water rinse between two steps of plating. In the first step of plating, the bath used has a relatively low rate of deposition as compared to the bath used in the second step. Also U.S. Pat. No. 4,160,049 to Narcus relates to a process for electroplating nickel onto a substrate wherein the plating is carried out in two stages using two baths of different compositions.

The plating after the acid treatment can be with the same plating bath as used in the initial treatment or with another plating bath if desired. Moreover, if desired, the plating after the acid treatment can be with a metal different than the metal employed in the first treatment prior to the acid treatment. However, it is preferred that the same metal be employed and deposited both in the initial and second plating procedures.

The following non-limiting example is presented to further illustrate the present invention.

EXAMPLE

1×1 inch samples of printed circuit boards scrapped because of the presence of plating voids from the electroless copper plating are treated by being immersed into a bath containing about 8 weight percent of HCl in water for about one minute at ambient temperature. The boards are removed from the bath without drying and are then inserted into deionized water rinse for about two minutes at ambient temperature. The boards are then removed from the deionized water without drying and inserted into a plating tank containing about 100 gallons of plating bath.

The plating bath is at a temperature of about 73° C., has a pH of 11.85, and EMIX of −690 millivolts, and a plating rate of about 0.103 mils per hour. The plating bath contains about 11.5 ppm of NaCN, about 10.04 grams per liter of $CuSO_4$, about 2.1 milliliters per liter of formaldehyde, about 2.4 ppm of dissolved oxygen, about 40.3 grams per liter of ethylene diamine tetraacetic acid, and has a specific gravity of about 1.066.

The plating is continued for about sixteen and one-half hours. The boards are removed from the plating bath and contain about 1.6 mils of new copper thereon.

The plating bath performed normally during the plating operation. The plating bath, after removal of the parts, has an EMIX of about −687 millivolts, a pH of 11.81, plating rate of 0.1 mils per hour, specific gravity of 1.064, a NaCN content of about 13 ppm, 10.2 grams per liter of $CuSO_4$, 2.4 milliliters per liter of formaldehyde, 2.5 ppm of dissolved oxygen, and 35.6 grams per liter of ethylene diamine tetraacetic acid. This illustrates that the bath is stable during the plating.

After the boards are removed from the plating bath, they are rinsed in stagnant deionized water and then rinsed in deionized water until freed of residual salts, which takes about one-fourth to about one-half of an hour. The boards are then air-dried.

The boards are inspected and found to be plated over those areas where voids previously existed.

What is claimed is:

1. A process for the deposition of a metal onto a substrate from an electroless plating composition wherein said substrate is catalytic for the deposition of said metal comprising the steps of:
   (a) plating an initial layer of an electroless platable metal from an electroless plating composition on said substrate;
   (b) contacting the resulting metal-plated substrate with an an aqueous solution of an acid composition containing about 5% to about 25% by weight of the acid, for about 1 to about 5 minutes; and
   (c) plating an additional layer of an electroless platable metal from an electroless plating composition onto the resulting plated, acid-treated substrate.

2. The process of claim 1 wherein said acid is in the form of an aqueous solution containing about 10% to about 25% by weight of the acid.

3. The process of claim 1 wherein the treatment with the acid is for about 1 to about 3 minutes.

4. The process of claim 1 wherein the acid is at a temperature of about room temperature or below during the contacting.

5. The process of claim 1 wherein said acid is hydrochloric acid.

6. The process of claim 1 wherein said metal is copper.

7. The process of claim 1 wherein said acid is an inorganic acid.

8. The process of claim 2 wherein the contacting with the acid is for about 1 to about 3 minutes.

9. The process of claim 5 wherein the aqueous solution of hydrochloric acid is at room temperature or below during the contacting.

10. The process of claim 1 wherein said acid is selected from the group of hydrochloride acid, nitric acid, phosphoric acid, and water soluble organic acids.

11. The process of claim 10 wherein said water soluble organic acid is selected from the group of formic acid and acetic acid.

12. The process of claim 1 wherein the metal of step (a) and the metal of step (b) are the same.

13. The process of claim 12 wherein said metal is copper.

14. The process of claim 1 wherein said initial layer is about 5% to about 95% of the total thickness.

15. The process of claim 1 wherein said initial layer is about 5% to about 50% of the total thickness of metal after step (c).

16. The process of claim 1 wherein said initial layer is about 5% to about 25% of the total thickness of metal after step (c).

17. The process of claim 1 wherein the plating in step (a) lasts about 1 to about 5 hours and the plating in step (c) lasts about 8 to about 20 hours.

* * * * *